US007484158B2

(12) United States Patent
Sharon et al.

(10) Patent No.: US 7,484,158 B2
(45) Date of Patent: Jan. 27, 2009

(54) METHOD FOR DECODING A LOW-DENSITY PARITY CHECK (LDPC) CODEWORD

(75) Inventors: Eran Sharon, Rishon-Lezion (IL); Simon Litsyn, Givat Shmuel (IL)

(73) Assignee: Infineon Technologies AG, Munich (DE)

( * ) Notice: Subject to any disclaimer, the term of this patent is extended or adjusted under 35 U.S.C. 154(b) by 734 days.

(21) Appl. No.: 11/003,940

(22) Filed: Dec. 3, 2004

(65) Prior Publication Data

US 2005/0204271 A1     Sep. 15, 2005

Related U.S. Application Data

(60) Provisional application No. 60/526,679, filed on Dec. 3, 2003.

(51) Int. Cl.
*H03M 13/00* (2006.01)
(52) U.S. Cl. ................ 714/755; 714/786; 714/794; 714/795; 714/801; 714/758; 375/341; 375/262
(58) Field of Classification Search ......... 714/790–792, 714/807, 796, 786, 752, 755, 758, 794–795, 714/801; 375/265, 295, 298, 316, 279, 308, 375/329, 262, 341
See application file for complete search history.

(56) References Cited

U.S. PATENT DOCUMENTS 7,415,079 B2 * 8/2008 Cameron et al. ............ 375/340

2003/0074626 A1 * 4/2003 Coker et al. ................ 714/752
2004/0252791 A1 * 12/2004 Shen et al. .................. 375/340
2005/0283707 A1 * 12/2005 Sharon et al. ............... 714/758

OTHER PUBLICATIONS

Gallager, R., "Low-Density Parity Check Codes", IRE Transformation Series, Jan. 1962, pp. 21-28, (8 pages).
Kschischang et al., "Iterative Decoding of Compound Codes by Probability propagation in Graphical Models", IEEE Journal on Selected Areas in communication, vol. 16, No. 1, Jan. 1998, pp. 1-11, (11 pages).

* cited by examiner

*Primary Examiner*—Guy J Lamarre
(74) *Attorney, Agent, or Firm*—Maginot, Moore & Beck

(57) ABSTRACT

A method for decoding a noisy codeword (y) received from a communication channel as the result of a LDPC codeword (b) having a number (N) of codeword bits is disclosed. Each codeword bit consists of k information bits and M parity check bits. The product of the LDPC codeword b and a predetermined (M×N) parity check matrix H is zero (H*bT=0) wherein the parity check matrix H represents a bipartite graph comprising N variable nodes (V) connected to M check nodes (C) via edges according to matrix elements hij of the parity check matrix H.—The method comprises receiving the noisy LDPC codeword (y) via said communication channel and calculating for each codeword bit (V) of said transmitted LDPC codeword (b) an a-priori estimate (Qv) that the codeword bit has a predetermined value. The method also comprises calculating iteratively messages on all edges of said bipartite graph according to a serial schedule and a message passing computation rule.

13 Claims, 16 Drawing Sheets bipartite Tanner graph $$H = \begin{bmatrix} 1 & 1 & 1 & 0 \\ 1 & 0 & 1 & 1 \end{bmatrix}$$

$$G = \begin{bmatrix} 1 & 0 & 1 & 0 \\ 0 & 1 & 1 & 1 \end{bmatrix}$$

FIG 10
BP decoding using the efficient serial decoder
Initialization
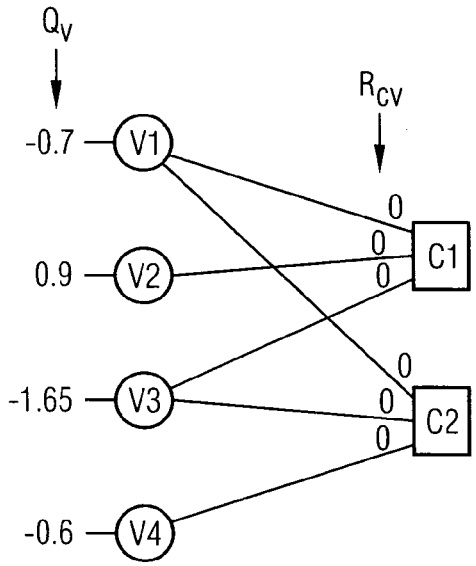
Iteration 1
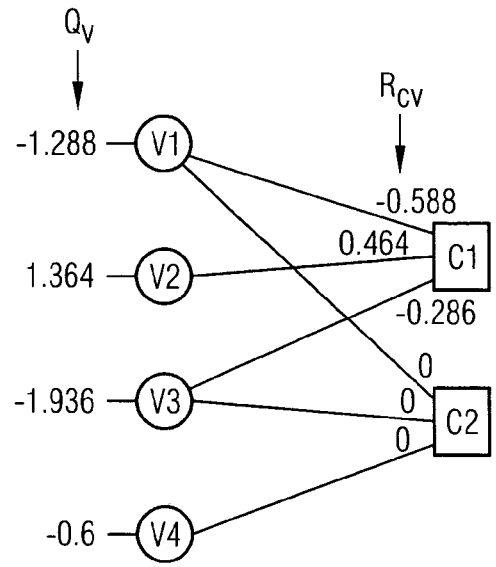
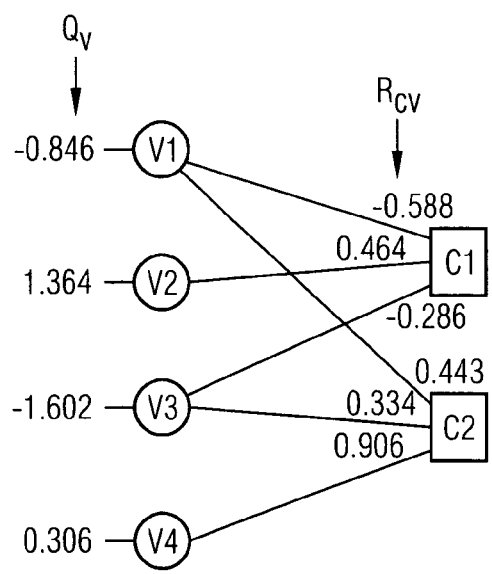

FIG 12

| Flood scheduling: | Efficient serial scheduling: |
|---|---|
| initilization:<br>for all $v \in V, c \in C$   $R_{cv} \leftarrow 0$<br>for all $v \in V, c \in C$   $Q_{vc} \leftarrow P_v$<br><br>iteration:<br>for all $c \in C$<br>for all $v \in N(c)$<br>$R_{cv} \leftarrow \varphi^{-1}(\Sigma_{v' \in N(v) \backslash c} \varphi(Q_{c'v}))$<br>end of loop<br>end of loop<br><br>for all $v \in V$<br>for all $v \in N(v)$<br>$Q_{vc} \leftarrow P_v + \Sigma_{c' \in N(v) \backslash c} R_{c'v}$<br>end of loop<br>end of loop<br><br>for all $v \in V$<br>$Q_v \leftarrow P_v + \Sigma_{c' \in N(v)} R_{cv}$<br>end of loop | initilization:<br>for all $v \in V, c \in C$   $R_{cv} \leftarrow 0$<br>for all $v \in V$   $Q_v \leftarrow P_v$<br><br>iteration:<br>for all $c \in C$<br>$s \leftarrow \Sigma_{v \in N(c)} \varphi(Q_v - R_{cv})$<br>for all $v \in N(c)$<br>$Q_{temp} \leftarrow Q_c - R_{cv}$<br>$R_{cv} \leftarrow \varphi^{-1}(S - \varphi(Q_{temp}))$<br>$Q_v \leftarrow Q_{temp} + R_{cv}$<br>end of loop<br>end of loop |

Flood and Serial decoding algorithms

Simulation results for a length 2400, irregular $(0.1316x + 0.5365x^2 + 0.3319x^7, x^6)$-LDPC code over the Gaussian channel with maximum of 10 iterations: (a) average iterations vs. Eb/No (b) Block Error Rate vs. Eb/No Simulation results for a length 2400, irregular $(0.1316x + 0.5365x^2 + 0.3319x^7, x^6)$-LDPC code over the Gaussian channel with maximum of 50 iterations: (a) average iterations vs. Eb/No (b) Block Error Rate vs. Eb/No

METHOD FOR DECODING A LOW-DENSITY PARITY CHECK (LDPC) CODEWORD

CROSS-REFERENCE TO RELATED APPLICATIONS

This application claims the benefit of earlier filed U.S. provisional application no. 60/526,679, filed Dec. 3, 2003.

BACKGROUND

This invention refers to the field of data communication and is in particular directed to redundant coding for error correction and detection.

Low-density parity check codes (LDPC) are a class of linear block codes which provide a near capacity performance on a large collection of data transmission and storage channels while simultaneously admitting implementable decoders. LDPC codes were first proposed by Gallager in his 1960 doctor dissertation (R. Gallager: "Low-density parity check codes", IRE transformation series pp 21-28, January 1962). From practical point of view, the most significant features of Gallager's work have been the introduction of iterative decoding algorithms for which he showed that, when applied to sparse parity check matrices, they are capable of achieving a significant fraction of the channel capacity with relatively low complexity. Furthermore in LDPC codes the number of computations per bit and per iteration is independent of the block length.

A parity check matrix H defines the LDPC code. To each parity check matrix H exists a corresponding bipartite Tanner graph having variable nodes (V) and check nodes (C). A check node C is connected to a variable node V when the element $h_{ij}$ of the parity check matrix H is 1. The parity check matrix H comprises M rows and N columns. The number of columns N corresponds to the number N of codeword bits within one encoded codeword Y transmitted via a communication channel. The codeword transmitted via the communication channel comprises K information bits and M parity check bits. The number of rows within the parity check matrix H corresponds to the number M of parity check bits in the codeword. In the corresponding Tanner graph there are M=N−K check nodes C, one check node for each check equation, and N variable nodes, one for each codebit of the codeword.

FIG. 1 shows an example for a sparse parity check matrix H and the corresponding bipartite Tanner graph.

LDPC codes have the ability to achieve a significant fraction of the channel capacity at relatively low complexity using iterative message passing decoding algorithms. These algorithms are based on the Tanner graph representation of codes, where the decoding can be understood as message passing between variable nodes V and check nodes C in the Tanner graph as shown in FIG. 1. Since messages are sent along the edges of the Tanner graph and are processed locally at each node of the Tanner graph one tries to keep the graph as sparse as possible to facilitate the subsequent iterative processing. Sparseness means that the number of edges between the variable nodes V and check nodes C is comparatively low, i.e. the corresponding check matrix H comprises a small number of ones.

How low density parity check LDPC codes do work is best demonstrated with a simple example as shown in FIGS. 2, 3.

FIG. 2 shows a simple Tanner graph for an LDPC code having four variable nodes $V_1$, $V_2$, $V_3$, $V_4$ and two check or constraint nodes $C_1$, $C_2$. Accordingly the block length of the codeword N=4 and the number of parity checkbits M=2. Consequently the number of information bits k is N−M=2.

The code rate R which is defined as the ratio between the number k of information bits and the block length N (R=k/N) is in this example ½.

The parity check matrix H corresponding to the bipartite Tanner graph is shown in FIG. 2.

For the LDPC code there exists a generator matrix G such that:

$$G \cdot H^T = \emptyset \qquad (1)$$

i.e. a product of the generator matrix G and the transposed corresponding parity check matrix $H^T$ is zero.

FIG. 3 shows two transceivers which are connected via the Additive White Gaussian Noise (AWGN) Channel. LDPC codes can be applied for any possible communication channel. During data transmission the communication channel corrupts the transmitted codeword so that a one become zero or vice versa. To diminish the bit error rate BER the transmitting transceiver comprises as shown in FIG. 3 an LDCP-encoder which multiplies an information bit vector i having K=2 information bits with the generator matrix G of the LDPC code. In the example of FIG. 2 the LDPC-encoder outputs an encoded bit vector b which is modulated by a modulator within the transceiver. In the given example the modulator transforms a low logical value zero of the coded bit vector b to a transmission bit X=1 and a logically high value of the encoded bit vector b is transformed to X=−1. The transmitting transceiver transmits the modulated codeword X via the communication channel to the receiving transceiver as shown in FIG. 3. In the given example the communication channel is a binary input AWGN channel with a single sided spectral noise density NØ=8.

The receiving transceiver receives a codeword Y from the communication channel having N values.

The codeword Y is formed by adding noise to the transmission vector X:

$$Y = X + \text{Noise} \qquad (2)$$

The received codeword Y is demodulated and log-likelihood ratios (LLR) of the received codeword bits are calculated. For a binary input AWGN channel the log-likelihood ratios LLR are calculated as following:

$$P_j = \ln\left(\frac{Pr(y_j/x_j = 1)}{Pr(y_j/x_j = -1)}\right) = \frac{4}{N_0} Y_j \qquad (3)$$

FIG. 3 shows the log-likelihood ratios for $N_0 = 8$, where each received codeword value is divided by two. The log-likelihood ratios LLR give an a-priori estimate that a received codeword bit has a predetermined value.

The estimates are forwarded to the LDPC decoder within the transceiver which performs the LDPC decoding process.

A conventional LDPC decoder employs a standard message passing schedule for decoding the LDPC code which is called a flooding schedule as described in F. R. Kschischang and B. J. Frey "Iterative decoding of compound codes by probability propagation in graphical models", IEEE J. Select. Areas Commun., vol. 16. Pp. 219-230, 1998.

A schedule is an updating rule which indicates the order of passing the messages between the nodes of the Tanner graph. A conventional LDPC decoder according to the state of the art employs a message passing procedure such as a belief propagation algorithm BP based on a flooding schedule.

FIG. 4 shows a flowchart of a belief propagation BP procedure employing a flooding schedule according to the state of the art.

FIG. 5 shows a belief propagation BP decoding process using the standard flooding procedure as shown in FIG. 4 with the example of FIG. 3.

As can be seen in FIG. 4 the received codeword Y is demodulated and log-likelihood ratios LLR are calculated.

In an initialization step S1 the messages $R_{cv}$ from the check nodes C to the variable nodes V are set to zero for all check nodes and for all variable nodes. Further the messages $Q_{vc}$ from the variable nodes to the check nodes within the Tanner graphs are initialized with the calculated a-priori estimates $P_v$ or log-likelihood ratios.

Further as shown in FIG. 4 an iteration counter iter is set to zero.

In a step S2 the messages $R_{cv}$ from the check nodes to the variable nodes QVC are updated. The calculation is performed by a check node processor as shown in FIG. 7.

The calculation performed by the check node processor can be described as follows:

$$S = \sum_{v \in N(c)} \varphi(Q_{vc}) \quad (4)$$

for all $v \in N(c)$:

$$R_{cv}^{new} = \varphi^{-1}(S - \varphi(Q_{vc}))$$

wherein $$\varphi(x) = \left(\text{sign}(x), -\log \tanh\left(\frac{|x|}{2}\right)\right)$$

$$\varphi^{-1}(x) = (-1)^{sign}\left(-\log\left[\tanh\left(\frac{x}{2}\right)\right]\right)$$

wherein the sign function is defined as:

$$\text{sign}(x) = \begin{Bmatrix} 0 & x \geq 0 \\ 1 & x < 0 \end{Bmatrix}$$

In a step S3 the messages $Q_{vc}$ from the variable nodes V to the check nodes C are updated by a symbol node processor as shown in FIG. 8.

The updating of the symbol to check messages $Q_{vc}$ can be described as follows:

$$Q_V = P_V + \sum_{C \in N(v)} R_{CV} \quad (5)$$

for all $C \in N(v)$ $$Q_{VC} = Q_V - R_{CV}$$

FIG. 5 shows the calculated check to symbol messages $R_{cv}$ and symbol to check messages $Q_{vc}$ after the first iteration step.

In a step S4 an estimate vector $\hat{b}$ is calculated from $Q_v$ according to the definition of the sign function and a syndrome vector S is calculated by multiplying the parity check matrix H with the calculated estimate vector $\hat{b}$:

$$\hat{b} = \text{sign}(Q)$$

$$s = H \cdot \hat{b} \quad (6)$$

In a step S5 the iteration counter iter is incremented.

In a step S6 it is checked whether the iteration counter has reached a predefined maximum iteration value, i.e. a threshold value or whether the syndrome vector S is zero. If the result of the check in step S6 is NO the procedure continues with the next iteration.

In contrast if the result of the check in step S6 is positive it is checked in step S7 whether the syndrome vector S is zero or not. If the syndrome vector S is not zero the iteration has been stopped because the maximum number of iterations has been reached which is interpreted as a decoding failure. Accordingly the LDPC decoder outputs a signal indicating the decoding failure. When it is realized that the syndrome vector S is zero the coding was performed successfully, i.e. the decoding process has converged. In this case the LDPC decoder outputs the last calculated estimated vector $\hat{b}$ as the correct decoded codeword.

For the given example of FIG. 3 the LDPC decoder of the receiving transceiver outputs the estimate vector $\hat{b} = (1010)^T$ and indicates that the decoding was performed successfully. Note that the decoded estimate vector $\hat{b}$ corresponds to the output of the LDPC encoder within the transmitting transceiver.

FIG. 6 shows a block diagram of a conventional LDPC decoder employing the belief propagation BP decoding algorithm and using the standard flooding schedule according to the state of the art.

The LDPC decoder according to the state of the art as shown in FIG. 6 receives via an input (IN) the calculated log-likelihood ratios LLRs from the demodulator and stores them temporarily in a RAM as initialization values.

This RAM is connected to several symbol node processors as shown in FIG. 8. The output of the symbol node processors is connected to a further RAM provided for the $Q_{vc}$ messages. The $Q_{vc}$-random access memory is connected to a ROM in which for every check node C of the Tanner graph the corresponding edges are memorized. This ROM controls a switching unit on the output side of the $Q_{vc}$-RAM. The output of the switching unit is connected to several check node processors as shown in FIG. 7 which update the check to symbol messages $R_{cv}$. The updated $R_{cv}$ messages are stored in a further RAM as shown in FIG. 6. At the output side the $R_{cv}$-RAM is connected to a further switching unit which is controlled by a further ROM in which for every variable node V within the Tanner graph the corresponding edges are stored. The output to the switching unit is connected to the symbol node processors.

The check node processors perform the update of the check to symbol messages $R_{cv}$ as described in connection with step S2 of the flowchart shown in FIG. 4. The updated check to symbol messages $R_{cv}$ are stored temporarily in the $R_{cv}$-RAM as shown in FIG. 6.

The symbol node processors perform the update of the symbol to check messages $Q_{vc}$ as described in connection with step S3 of the flow chart shown in FIG. 4. The updated symbol to check messages $Q_{vc}$ are stored temporarily in the $Q_{vc}$-RAM.

The conventional LDPC decoder as shown in FIG. 6 further comprises a RAM for the output $Q_v$ messages calculated by the symbol node processors.

A convergence testing block computes the estimate $\hat{b}$ and calculates the syndrome vector S as described in connection with step S4 of the flow chart of FIG. 4. Further the convergence testing block performs the checks according to steps S5, S6, S7 and indicates whether the decoding was successful, i.e. the decoder converged. In case that the decoding was successful the last calculated estimate is output by the LDPC decoder.

The conventional LDPC decoder employing a flooding update schedule as shown in FIG. 6 has several disadvantages.

The number of iterations necessary until the decoding process has converged is comparatively high. Accordingly the decoding time of the conventional LDPC decoder with flooding schedule is high. When the number of decoding iterations defined by the threshold value is limited the performance of the LDPC decoder according to the state of the art is degraded.

A further disadvantage of the conventional LDPC decoding method and the corresponding LDPC decoder as shown in FIG. 6 is that checking whether the decoding has converged is complicated and it is necessary to provide a separate converging testing block for processing a convergence testing. The convergence testing block of a conventional LDPC decoder as shown in FIG. 6 calculates a syndrome vector S by multiplying the parity check matrix H with the estimate vector $\hat{b}$.

Another disadvantage of the conventional LDPC decoding method employing a flooding schedule and the corresponding LDPC decoder as shown in FIG. 6 resides in that the necessary memory size is high. The LDPC decoder as shown in FIG. 6 comprises four random access memories (RAM), i.e. the RAM for the input $P_v$ messages, a RAM for the output $Q_v$ messages, a further RAM for the $Q_{vc}$ messages and finally a RAM for the $R_{cv}$ messages. Furthermore the LDPC decoder includes two read only memories (ROM) for storing the structure of the Tanner graph.

Accordingly it is the object of the present invention to provide a method for decoding a low density parity check codeword and a corresponding LDPC decoder overcoming the above mentioned disadvantages, in particular providing a decoding method which needs a small number of iterations for decoding a received codeword.

SUMMARY

The invention provides a method for decoding a noisy codeword (Y) received from a noisy channel, as a result of transmitting through the noisy channel a codeword (b) having a number (N) of codeword bits which belongs to a length (N) low-density parity-check code for which a (M×N) parity check matrix (H) is provided and which satisfies $H*b^T=0$, wherein codeword (Y) has a number (N) of codeword bits which consists of K information bits and M parity check bits, wherein the parity check matrix H represents a bipartite graph comprising N variable nodes (V) connected to M check nodes (C) via edges according to matrix elements $h_{ij}$ of the parity check matrix H, wherein the method comprises the following steps:
(a) receiving the LDPC codeword (Y) via a communication channel;
(b) calculating for each codeword bit of said received LDPC codeword (Y) an a priori estimate that the codeword bit has a predetermined value from the received codeword (Y) and from predetermined parameters of said communication channel;
(c) storing the calculated estimates in a memory as initialization variable node values;
(d) calculating iteratively messages on all edges of said bipartite graph according to the following serial schedule: in each iteration, for each check node (C) of said bipartite graph, for all neighboring variable nodes (V) connected to said check node (C) input messages ($Q_{vc}$) to said check node (C) from said neighboring variable nodes (V) and output messages ($R_{cv}$) from the check node (C) to said neighboring variable nodes (V) are calculated by means of a message passing computation rule.

The main advantage of the method according to the present invention is that the decoder converges in approximately half the number of iterations. As a result the performance of a LDPC decoder employing a serial schedule is better than the performance of a LDPC decoder employing a flooding schedule when the number of decoder iterations is limited as in any practical application. Alternatively, for a given performance and decoder throughput, approximately half the processing hardware is needed for a LDPC decoder employing a serial schedule compared to a LDPC decoder employing a flooding schedule. A further advantage of the LDPC decoding method according to the present invention and the corresponding LDPC decoder is that the memory size of the LDPC decoder according to the present invention is approximately half the size compared to the necessary memory size of the corresponding LDPC decoder according to the state of the art as shown in FIG. 6.

The decoding method according to the present invention can be applied to generalized LDPC codes, for which the left and right side nodes in the bipartite graph represent constraints by any arbitrary code. In a preferred embodiment of the decoding method according to the present invention, the codes for which the decoding is applied are LDPC codes in which the left side nodes represent constraints according to repetition codes and the right side nodes represent constraints according to parity-check codes. In this preferred embodiment the generalized check node processor is as shown in FIG. 13.

In a preferred embodiment of the decoding method according to the present invention the message passing procedure is a belief propagation (BP) procedure which is also known as the Sum-Product procedure.

In an alternative embodiment the message passing procedure is a Min-Sum procedure.

In a preferred embodiment of the method for decoding a low density parity check codeword according to the present invention the calculated a-priory estimates are log-likelihood ratios (LLR).

In an alternative embodiment the calculated a-priori estimates are probabilities.

In a preferred embodiment of the method for decoding a low density parity check codeword a decoding failure is indicated when the number of iterations reaches an adjustable threshold value.

In the following preferred embodiments of the method for decoding a low density parity check codeword and of a corresponding LDPC decoder are described with reference to the enclosed figures.

BRIEF DESCRIPTION OF THE DRAWINGS

FIG. 10 shows several iteration steps of the LDPC decoding method according to the present invention for the simple example of FIGS. 2, 3;

FIG. 12 shows a table for comparing an LDPC encoding procedure using a conventional flooding schedule and an LDPC decoding method using an efficient serial schedule according to the present invention;

DESCRIPTION

Figure 9:
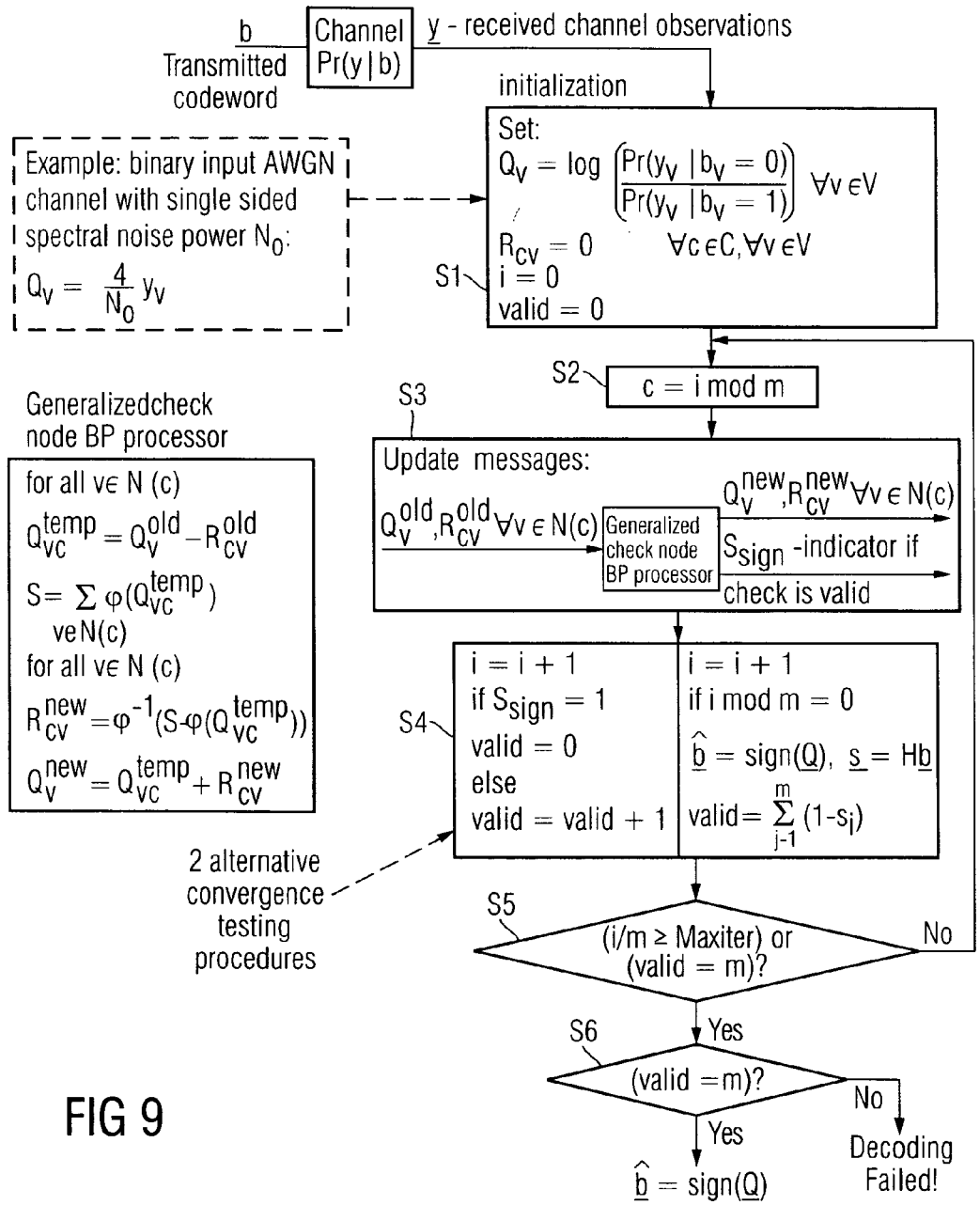
FIG. 9 shows a flowchart of a belief propagation (BP)-LDPC decoder using a serial schedule according to the present invention.
Figure 16:
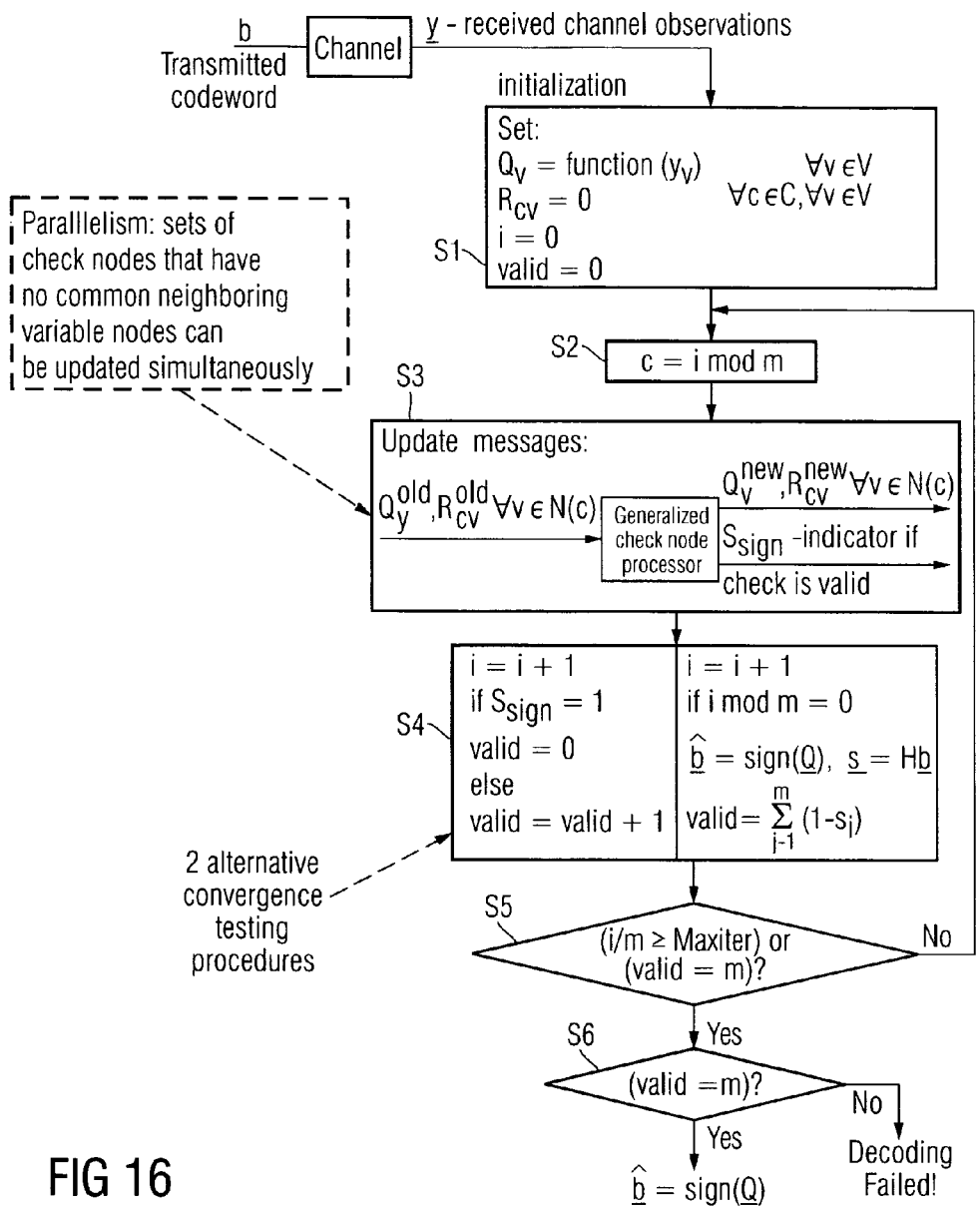
FIG. 16 shows a flowchart of a general message passing decoder using a serial schedule according to the present invention.

As can be seen from FIG. 9 the method for decoding a low density parity check codeword according to the present invention is performed on the basis of the received channel observation, i.e. the estimate values or estimates which indicate that a received codeword bit has a predetermined value. The estimates are calculated from the received codeword Y and predetermined parameters of the communication channel. The predetermined parameters of the communication channel are known. In an alternative embodiment of the present invention, if the parameters of the communication channel are unknown, a Min-Sum message-passing computation rule can be used, for which the parameters of the communication channel are not needed. A general message passing decoding procedure covering all embodiments is shown in FIG. 16. In a preferred embodiment the estimates are the log-likelihood ratios of the received bits (LLR).

Figure 11:
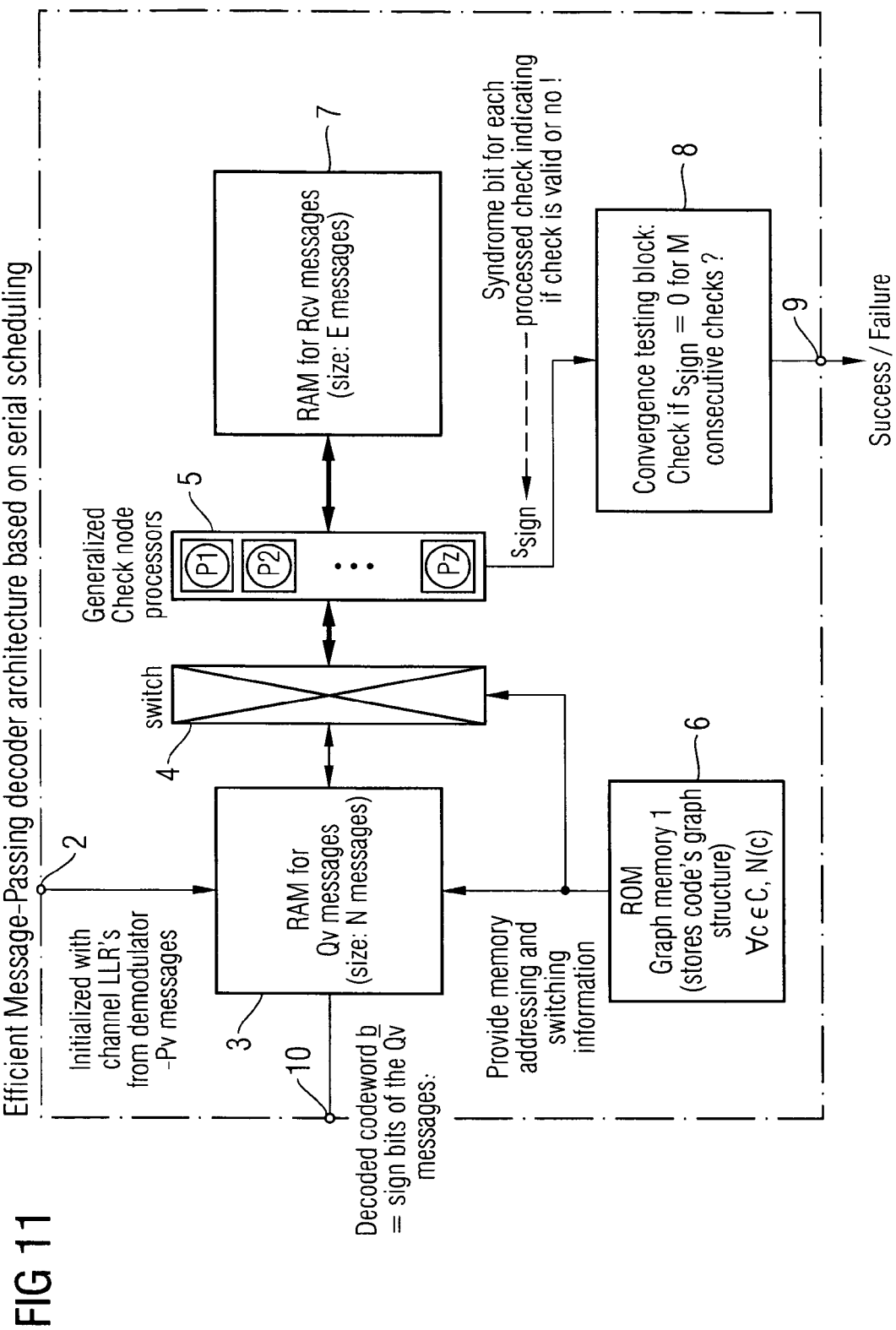
FIG. 11 shows a block diagram of a LDPC decoder employing a serial schedule according to the present invention.

FIG. 11 shows a block diagram of a preferred embodiment of the LDPC decoder 1 according to the present invention. The LDPC decoder 1 has an input 2 and receives the a-priori estimate values based on the channel observations from the demodulator. The a-priori estimates are in a first embodiment calculated a-priori log-likelihood ratios (LLR). In an alternative embodiment the calculated estimates are a-priori probabilities.

In an initialization step S1 as shown in FIG. 9 the calculated log-likelihood ratios or probabilities are stored temporarily as initialization values in a random access memory (RAM) 3 within the LDPC decoder 1. The memory 3 is connected via a switching unit 4 to a block including several generalized check node processors. The generalized check node processors are also connected to a random access memory 7. The memory 3 and the switching unit 4 are controlled by a read only memory 6 storing the bipartite Tanner graph of the used LDPC code. The generalized check node processors 5 are provided for updating the messages between the nodes of the Tanner graph. The generalized check node processors are provided with $R_{cv}$ messages from memory 7 and with $Q_v$ messages from memory 3 via the switching unit 4. The generalized check node processors compute new updated values for the $R_{cv}$ and $Q_v$ messages. The updated $R_{cv}$ messages are stored back in memory 7 and the updated $Q_v$ messages are stored back in memory 3 via the switching unit 4.

In a preferred embodiment of the present invention the generalized check node processors 5 output for each check node of the bipartite Tanner graph a sign bit $S_{sign}$ which is checked by a convergence testing block 8 which checks whether the LDPC decoder 1 has converged. In an alternative embodiment of the present invention a standard convergence testing block can be used as shown in FIG. 9 step S4 (right alternative). When the converging testing block 8 realizes that the LDPC decoding process has converged it indicates this by outputting a success indication signal via output 9 of the LDPC decoder 1. In case that no convergence could be achieved the LDPC decoder 1 indicates such a failure via output 9. In case of success the LDPC decoder 1 outputs the decoded codeword calculated in the last iteration step via a data output 10.

Figure 7:
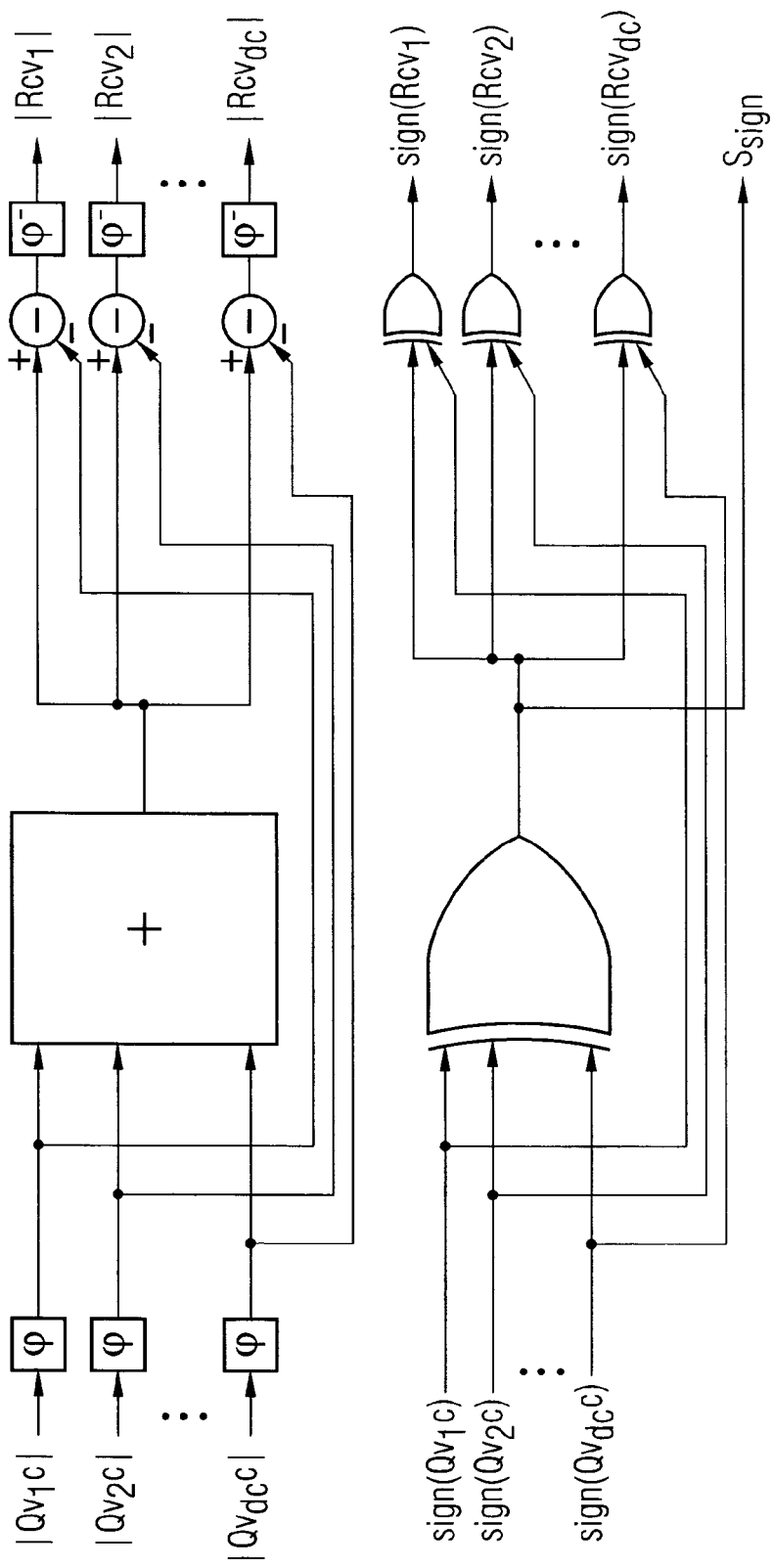
FIG. 7 shows a circuit diagram of a check node processor within a conventional LDPC decoder as shown in FIG. 6.
Figure 8:
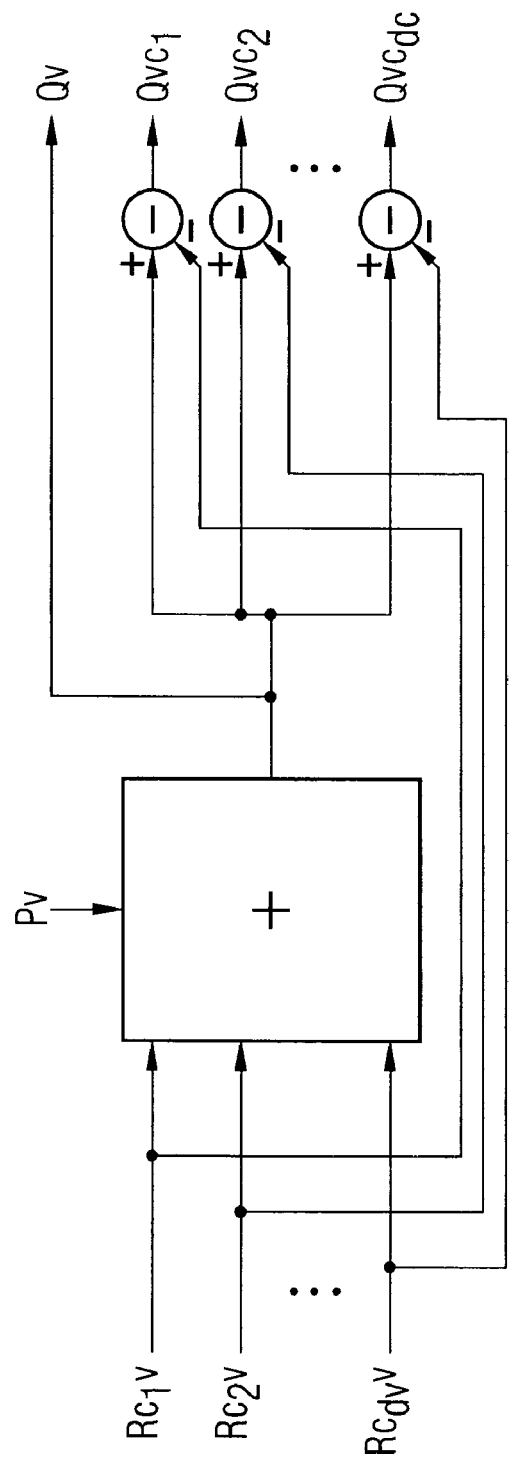
FIG. 8 shows a circuit diagram for a symbol node processor as provided within an LDPC decoder according to the state of the art as shown in FIG. 6.
Figure 13:
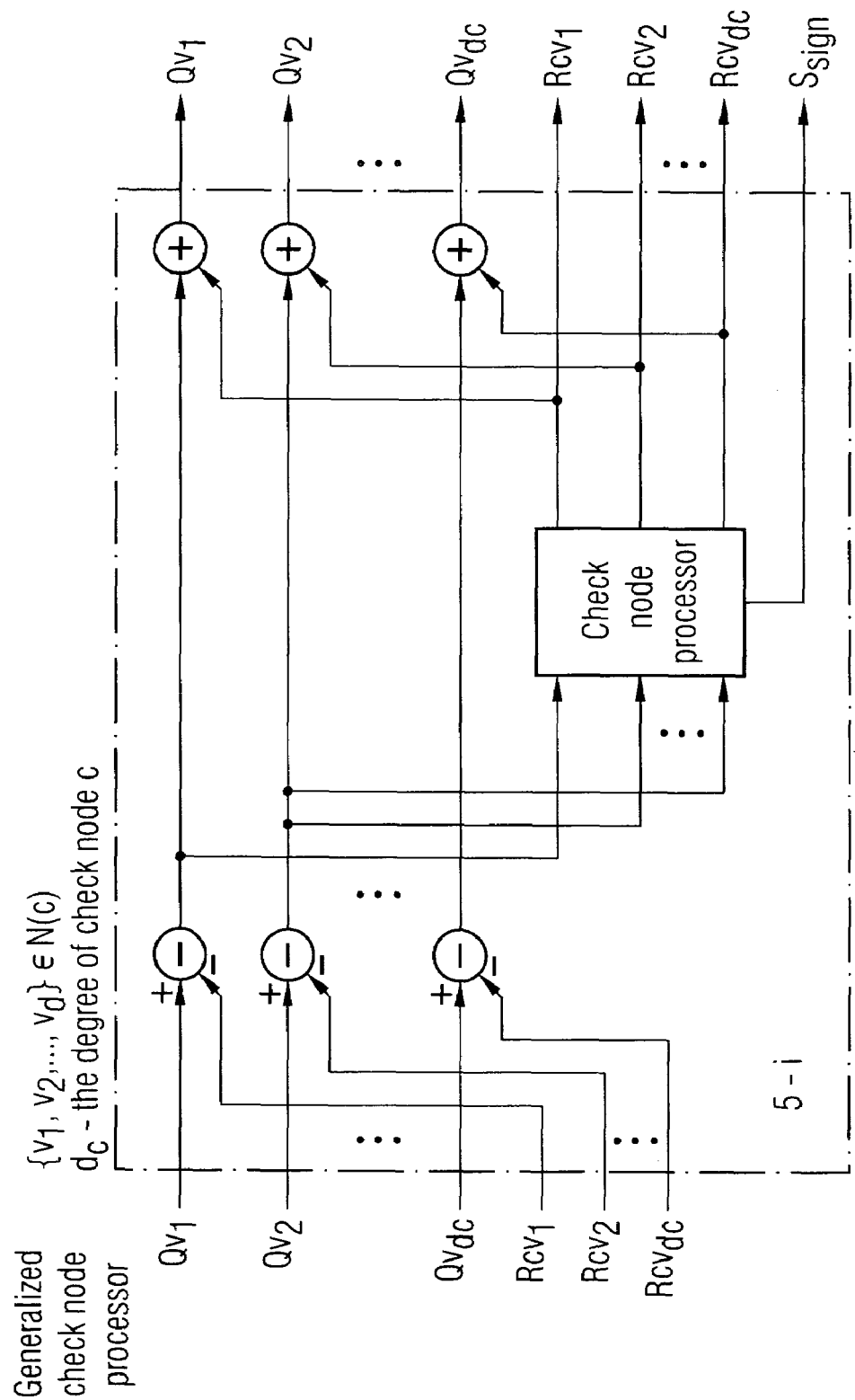
FIG. 13 shows a circuit diagram of a generalized check node processor as provided within an LDPC decoder according to the present invention as shown in FIG. 11.

The generalized check node processor 5 of FIG. 11 is shown in more detail in FIG. 13, wherein each generalized check node processor 5 includes a conventional check node processor shown in FIG. 7 and further subtracting and summing means.

In the initialization step S1 shown in FIG. 9 the check to symbol messages $R_{cv}$ are initialized with the value zero for all check nodes and for all variable nodes. Further an iteration counter i is set to zero. A further counter (valid) is also initialized to be zero.

In a step S2 a check node number c is calculated depending on the iteration counter i and the number of check nodes M within the Tanner graph:

$$c = i \bmod m \quad (7)$$

In step S3 the generalized check node processors 5 perform the updating of the messages corresponding to check node c. In a preferred embodiment of the present invention the generalized check node processor implements a BP computation rule according to the following equations:

$$R_{cv}^{new} = \phi^{-1}(S - \phi(Q_{vc}^{temp}))$$

$$Q_V^{new} = Q_{vc}^{temp} + R_{CV}^{new} \quad (8)$$

for all $v \in N(C)$, wherein $N(C)$ is the set of neighboring nodes of check node c and wherein $$Q_{VC}^{temp} = Q_V^{old} - R_{CV}^{old}$$

$$S = \sum_{v \in N(c)} \varphi(Q_{vc}^{temp})$$

with $$\varphi(x) = \left(\text{sign}(x), -\log\tanh\left(\frac{|x|}{2}\right)\right)$$

$$\varphi^{-1}(x) = (-1)^{sign}\left(-\log\left(\tanh\left(\frac{x}{2}\right)\right)\right)$$

and with $$\text{sign}(x) = \begin{Bmatrix} 0 & x \geq \emptyset \\ 1 & x < \emptyset \end{Bmatrix}$$

In an alternative embodiment of the present invention the generalized check node processor implements a Min-Sum computation rule according to the following equations:

for all $v \in N(c)$ $$Q_{vc}^{temp} = Q_v^{old} - R_{cv}^{old}$$

for all $v \in N(c)$ $$R_{cv}^{new} = \prod_{v' \in N(c)/v} (-1)^{sign(Q_{v'c}^{temp})} \min_{v' \in N(c)/v}\{Q_{v'c}^{temp}\}$$

$$Q_v^{new} = Q_{vc}^{temp} + R_{cv}^{new}$$

For each check node c of the bipartite Tanner graph and for all neighboring nodes connected to said check node c the input messages $Q_{vc}$ to the check node from the neighboring variable nodes v and the output messages $R_{cv}$ from said check node c to said neighboring variable nodes v are calculated by means of a message-passing computation rule. Instead of calculating all messages $Q_{vc}$ from variable nodes V to check nodes c and then all messages $R_{cv}$ from check node c to variable nodes v as done in the flooding schedule LDPC decoder according to the state of the art. The decoding method according to the present invention calculates serially for each check node c all messages $Q_{vc}$ coming into the check node C and then all messages $R_{cv}$ going out from the check node c.

This serial schedule according to the present invention enables immediate propagation of the messages in contrast to the flooding schedule where a message can propagate only in the next iteration step.

The messages $Q_{vc}$ are not stored in a memory. Instead, they are computed on the fly from the stored $R_{cv}$ and $Q_v$ messages according to $Q_{vc}=Q_v-R_{cv}$.

All check nodes c which have no common neighboring variable nodes can be updated in the method according to the present invention simultaneously.

After the messages have been updated by the check node processors 5 in step S3 the iteration counter i is incremented in step S4.

In one preferred embodiment of the present invention, in step S3 an indicator $$S_{sign} = \text{Sign}\left(\sum_{v \in N(c)} \varphi(Q_{vc}^{temp})\right)$$

is calculated by the check node processors 5 indicating whether the check is valid. In step S4 if $S_{sign}=1$ (check is not valid) the valid counter is reset (valid=0). In contrast when the check is valid ($S_{sign}=0$) the valid counter is incremented in step S4.

In another embodiment of the present invention a standard convergence testing mechanism is used as shown in FIG. 16, in which in step S4 a syndrome s=Hb̂ is computed where b̂=sign(Q).

In step S5 it is checked whether the number of iterations (i/m) is higher than a predefined maximum iteration value, i.e. threshold value or whether the valid counter has reached the number of check nodes m. If the result of the check in step S5 is negative the process returns to step S2. If the result of the check in step S5 is positive it is checked in step S6 whether the valid counter is equal to the number M of check nodes. If this is not true, i.e. the iteration was stopped because a maximum iteration value MaxIter has been reached the LDPC decoder 1 outputs a failure indicating signal via output 9. In contrast when the valid counter has reached the number of check nodes M the decoding was successful and the LDPC decoder 1 outputs the last estimate b̂ as the decoded value of the received codeword.

$$b̂ = \text{Sign}(Q)$$

Figure 1:
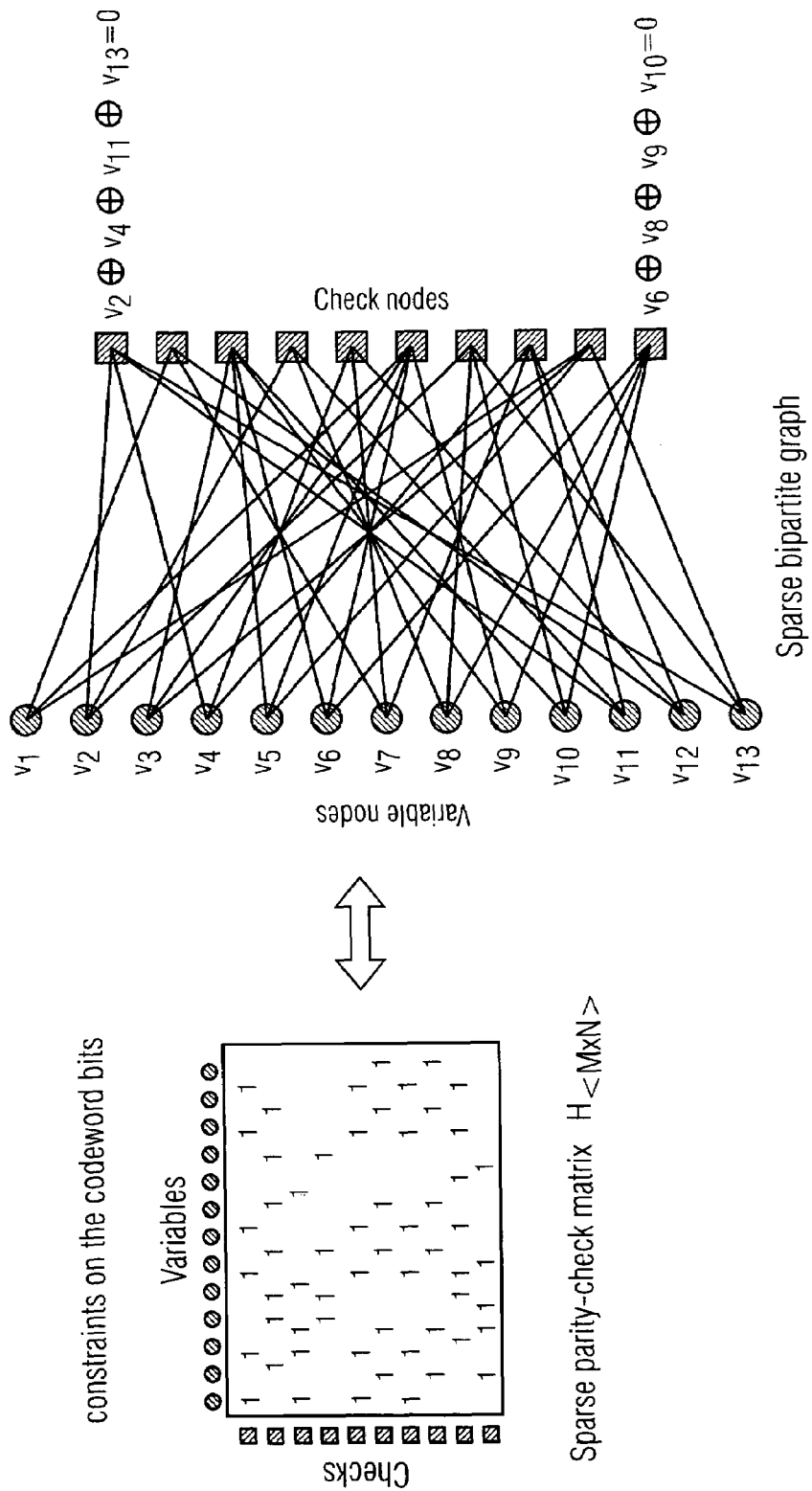
FIG. 1 shows an example of a sparse parity check matrix H and a corresponding bipartite Tanner graph according to the state of the art.
Figure 2:
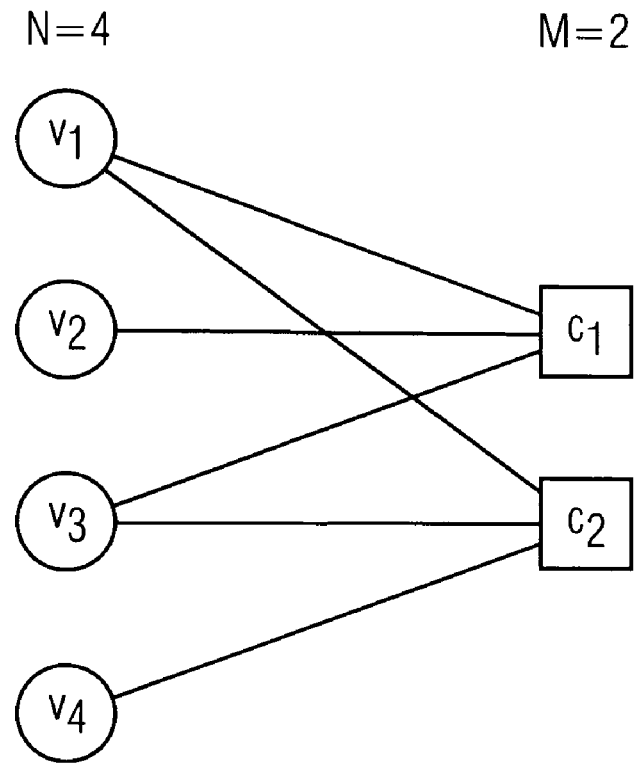
FIG. 2 shows a simple example of a bipartite Tanner graph according to the state of the art.
Figure 3:
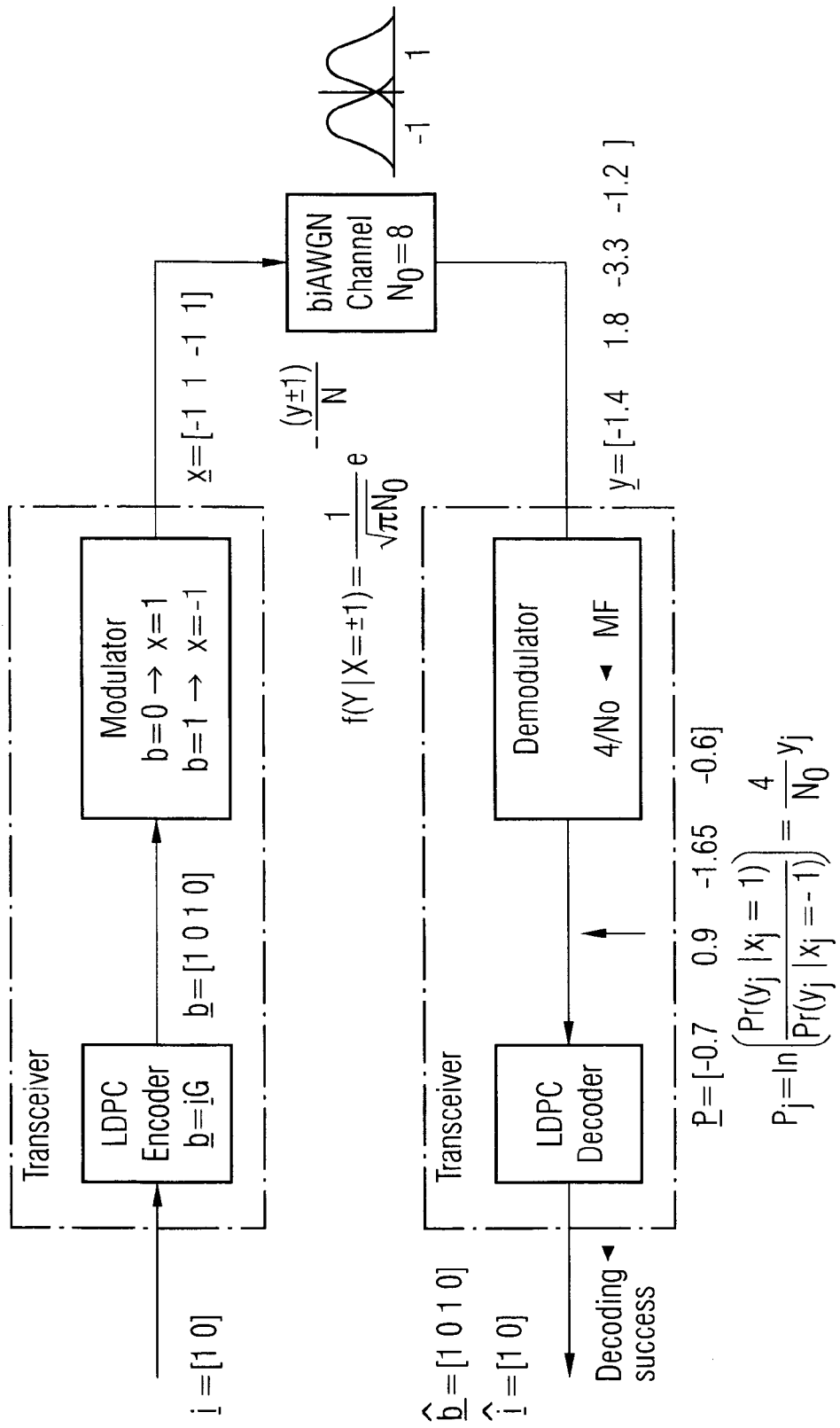
FIG. 3 shows transceivers connected via a data communication channel including a LDPC encoder and a LDPC decoder for decoding the LDPC code defined by the bipartite Tanner graph as shown in FIG. 2.
Figure 4:
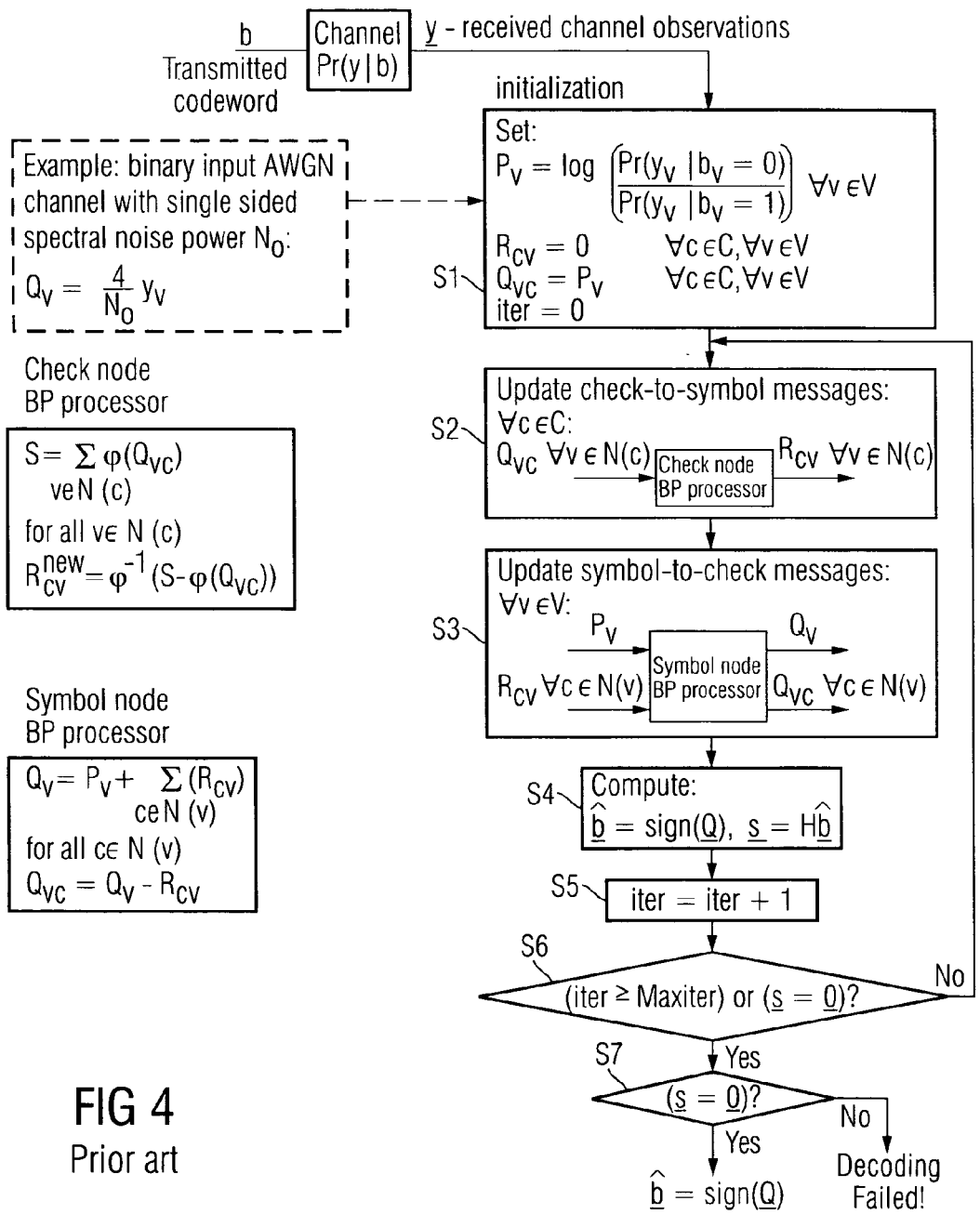
FIG. 4 shows a flow chart of a belief propagation (BP)-LDPC decoder employing a flooding schedule according to the state of the art.

FIG. 10 shows a belief propagation decoding procedure performed by the LDPC decoder 1 according to the present invention using the algorithm shown in FIG. 9 for the simple examples of FIGS. 2, 3.

The calculated log-likelihood ratios LLRs output by the demodulator P=[−0.7 0.9 −1.65 −0.6] are stored as decoder inputs in the memory 3 of the LDPC decoder 1. The memory 7 which stores the check to symbol messages $R_{cv}$ is initialized to be zero in the initialization step S1.

In the given example of FIG. 10 the LDPC decoder 1 performs one additional iteration step (iteration 1) before convergence of the decoder 1 is reached. For each check node c1, c2 the symbol to check messages $Q_{vc}$ are computed or calculated for each variable node V which constitutes a neighboring node of said check node c. Then for each variable node which is a neighboring node of said check node c the check to symbol messages $R_{cv}$ and the a-posteriori messages $Q_v$ are updated using the above mentioned equations in step S3 of the decoding method and stored in memory 7 and memory 3 respectively.

The convergence testing block 8 counts the valid checks according to the sign values $S_{sign}$ received from the generalized check node processor. A check is valid if $S_{sign}=0$. Once M consecutive valid checks have been counted (M consecutive Ssign variables are equal to 0), it is decided that the decoding process has converged and the actual estimate value b̂=Sign(Q) is output by terminal 10 of the LDPC decoder 1.

Alternatively, the standard convergence testing block used by the state of the art flooding decoder can be used for the serial decoder as well. The standard convergence testing block computes at the end of each iteration a syndrome vector $s=Hb^T$, where b=sign(Q). If the syndrome vector is equal to the 0 vector then the decoder converged. In the given example, the serial decoder converges after one iteration.

Figure 5:
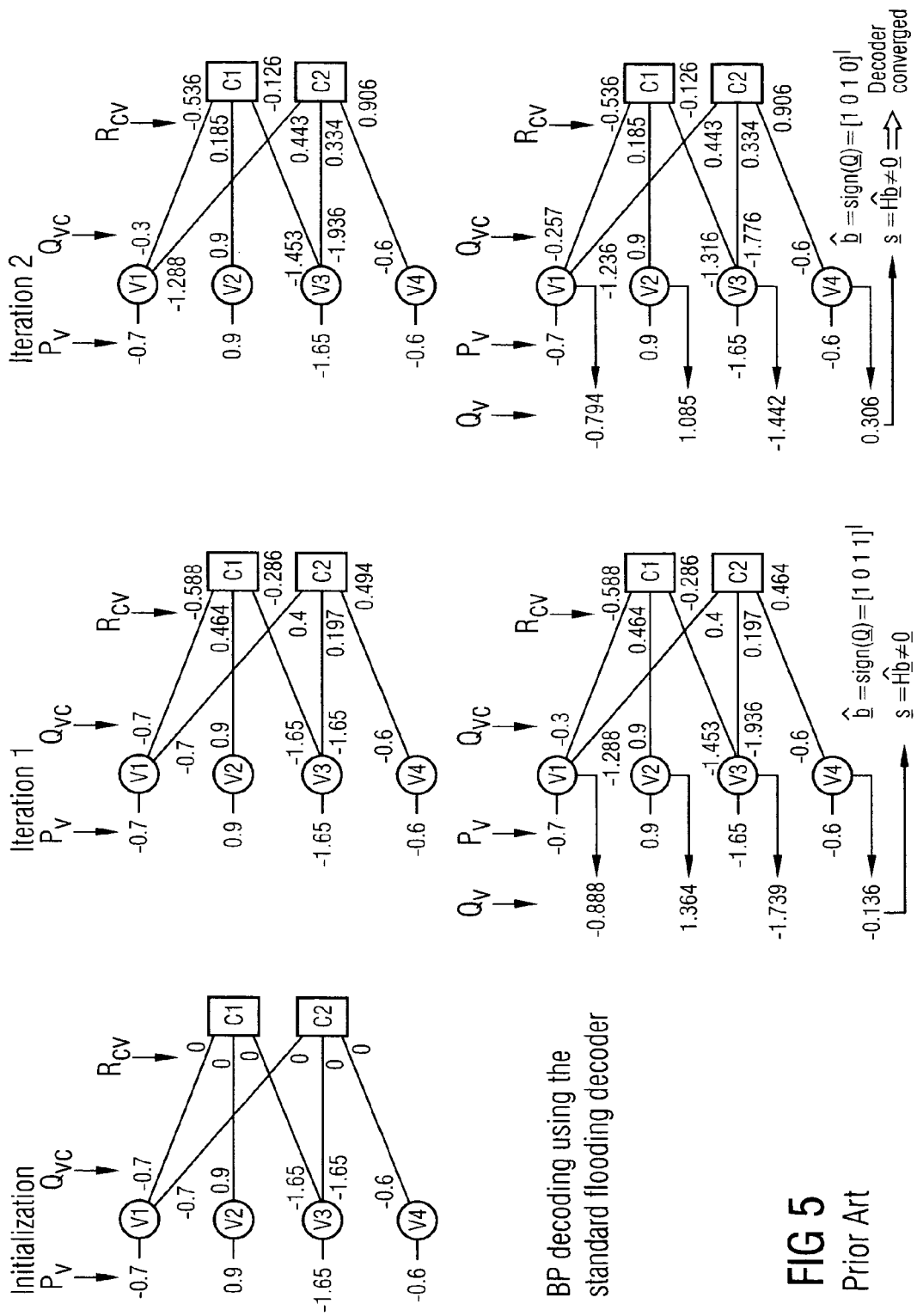
FIG. 5 shows several iteration steps for a belief propagation LDPC decoder using the standard flooding schedule according to the state of the art.

By comparing FIG. 10 with FIG. 5 it becomes evident, that the decoding method according to the present invention (FIG. 10) needs only one iteration step whereas the conventional LDPC decoding method (FIG. 5) which uses the flooding schedule needs two iteration steps before the decoder has converged.

Accordingly one of the major advantages of the LDPC decoding method according to the present invention is that average number of iterations needed by the LDPC decoder 1 according to the present invention is approximately half the number of iterations that are needed by a conventional LDPC decoder using a flooding schedule.

Figure 14A:
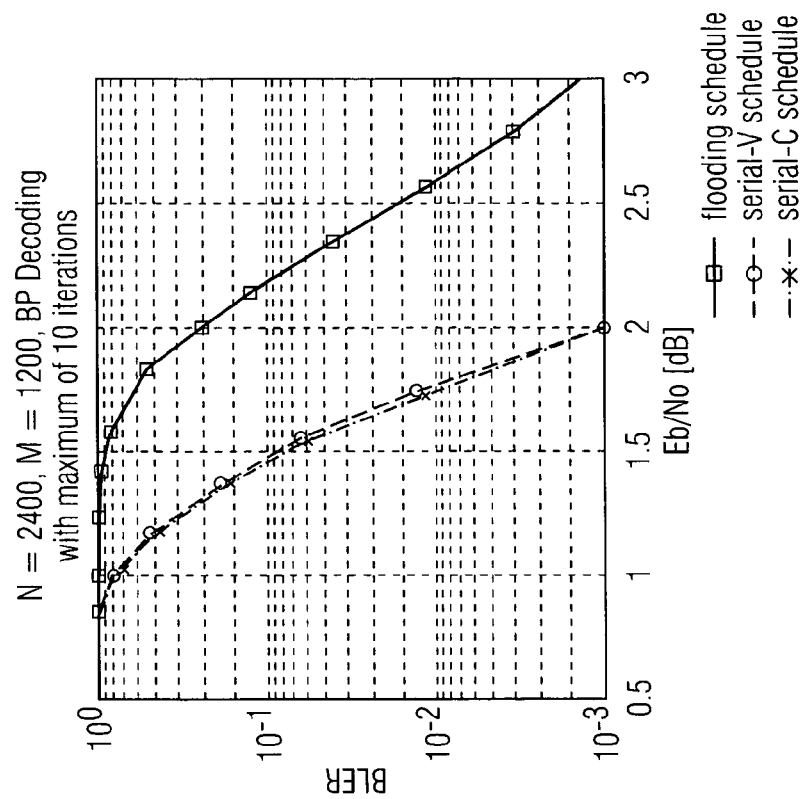
FIG. 14(a) shows a simulation result of the average number of iterations necessary for a conventional LDPC decoder employing a flooding schedule and an LDPC decoder according to the present invention employing a serial schedule, when the decoders are limited to 10 iterations.
Figure 15A:
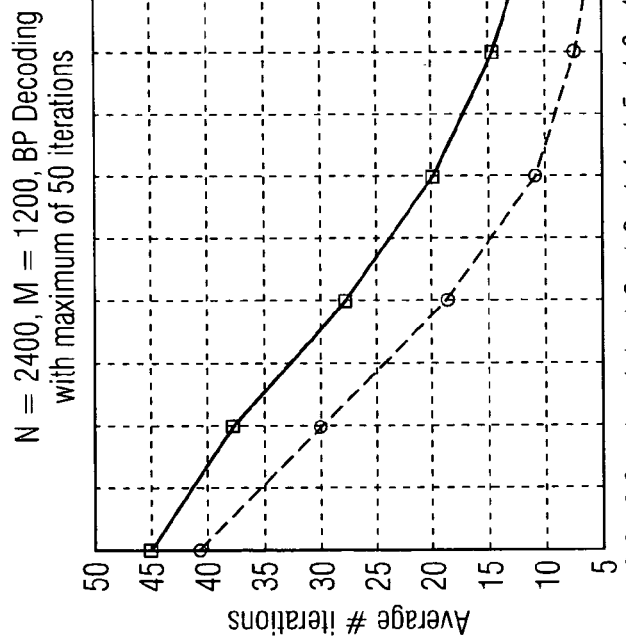
FIG. 15(a) shows a simulation result of the average number of iterations for a conventional flooding schedule LDPC decoder and an LDPC decoder according to the present invention employing a serial schedule, when the decoders are limited to 50 iterations.

FIG. 14(a), FIG. 15(a) show a simulation result for a block length N=2400 and an irregular LDPC code over a Gaussian channel for ten and for fifty iterations. As becomes evident from FIGS. 14(a), 15(a) the necessary number of iterations for an LDPC decoder 1 according to the present invention using a serial schedule is significantly lower than the number of iterations needed by a conventional LDPC decoder using a flooding schedule.

Figure 14B:
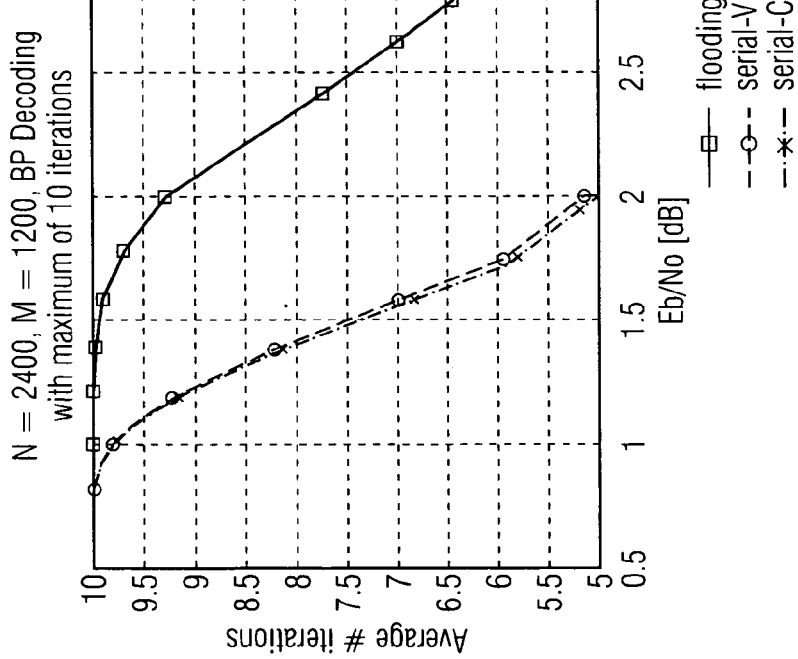
FIG. 14(b) shows a simulation result of the block error rate for a LDPC decoder according to the state of the art employing a flooding schedule and of an LDPC decoder according to the present invention employing a serial schedule, when the decoders are limited to 10 iterations.
Figure 15B:
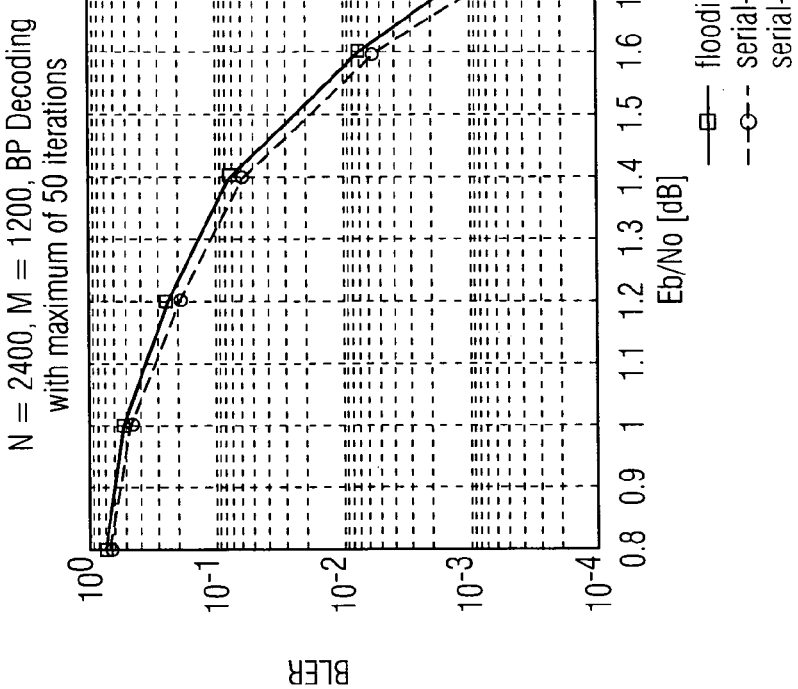
FIG. 15(b) shows the block error rate of a conventional flooding schedule LDPC decoder in comparison to an LDPC decoder according to the present invention employing a serial schedule, when the decoders are limited to 50 iterations.

Further the performance of the LDPC decoder 1 according to the present invention is superior to the performance of a conventional LDPC decoder using a flooding schedule. FIGS. 14(b), 15(b) show a simulation result of the block error rate BER of the LDPC decoder 1 in comparison to a conventional LDPC decoder for ten and fifty iterations. As can be seen from FIGS. 14(b), 15(b) the block error rate BLER performance of the LDPC decoder 1 according to the present invention is significantly better than the block error rate BLER performance of the conventional LDPC decoder using a flooding schedule when the number of iterations that the decoder is allowed to perform is limited.

Figure 6:
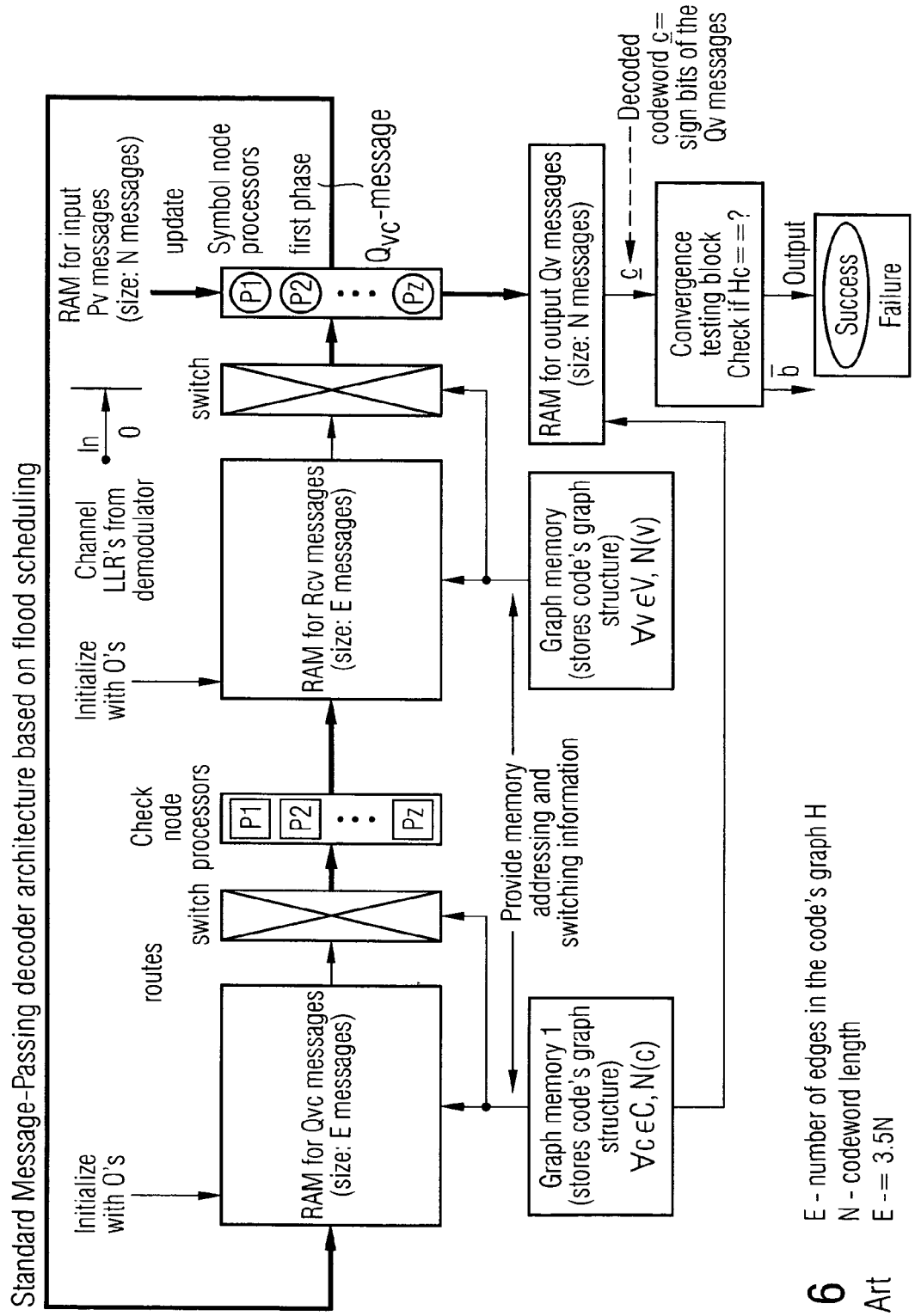
FIG. 6 shows a block diagram of a conventional LDPC decoder according to the state of the art.

A further advantage of the LDPC decoder 1 according to the present invention as shown in FIG. 11 is that the memory size of the memories 3, 7 within the LDPC decoder 1 according to the present invention is significantly lower (half the memory size) than the memory size of the random access memories (RAM) provided within the state of the art LDPC decoder shown in FIG. 6. Since in the LDPC decoder 1 a serial schedule is employed it is not necessary to provide a memory for the $Q_{vc}$ messages. Since the same memory which is initialized with messages $P_v$ is used also for storing the messages $Q_v$ the LDPC decoder 1 having an architecture which is based on the serial schedule requires only a memory for E+N messages (while the state of the art LDPC decoder shown in FIG. 6 requires memory for 2E+2N messages), where E is the number of edges in the code's Tanner graph (usually, for capacity approaching LDPC codes E~=3.5N).

A further advantage of the LDPC decoder 1 employing the decoding method according to the present invention is that only one data structure containing N(C) for all check nodes c∈C is necessary. In the standard implementation of a conventional LDPC decoder using the flooding schedule two different data structures have to be provided requiring twice as much memory for storing the bipartite Tanner graph of the code. If an LDPC decoder using the conventional flooding schedule is implemented using only a single data structure an iteration has to be divided into two non overlapping calculation phases. However, this results in hardware inefficiency and increased hardware size.

It is known that LDPC codes which approach the channel capacity can be designed with concentrated right degrees, i.e. the check nodes c have constant or almost constant degrees. In such a case only the variable node degrees are different. While the conventional flooding LDPC decoder for such irregular codes needs a more complex circuitry because computation units for handling a varying number of inputs are needed a implemented LDPC decoder according to the present invention remains with the same circuit complexity even for such irregular codes. The reason for that is that the LDPC decoder 1 employing the serial schedule requires only a check node computation unit which handles a constant number of inputs.

A further advantage of the LDPC decoder 1 in comparison to a conventional LDPC decoder is that a simpler convergence testing mechanism can be used. Whereas the LDPC decoder according to the state of the art has to calculate a syndrome vector S, the indicator $S_{sign}$ of the LDPC decoder 1 is a by-product of the decoding process. In the convergence testing block 8 of the LDPC decoder 1 according to the present invention it is only checked whether the sign of the variable $S_{sign}$ is positive for M consecutive check nodes. And there is no need to perform a multiplication of the decoded word with the parity check matrix H at the end of each iteration step in order to check whether convergence has been reached.

Iterations of a LDPC decoder employing a flooding schedule can be fully parallised, i.e. all variable and check node messages are updated simultaneously. The decoding method according to the present invention is serial, however, the messages from sets of nodes can be updated in parallel. When the check nodes are divided into subsets such that no two check nodes in a subset are connected to the same symbol node V then the check nodes in each subset can be updated simultaneously.

The decoding schedule for low density parity check codes according to the invention out-performs the conventional approach in terms of complexity with no degradation in performance. With the method for decoding a low density parity check codeword according to the present invention the updating of the variable nodes is performed according to the serial schedule which propagates the information between the nodes much more rapidly. As a consequence the average number of iterations needed for successful for decoding is asymptotically half of the number needed in the conventional flooding schedule with no degradation in the performance. Another implementation advantage of the LDPC decoder 1 according to the present invention is that smaller memories are required and that the convergence testing mechanism is simplified.

FIG. 12 shows a table which shows the flooding schedule used by the conventional LDPC decoder in comparison to the efficient serial scheduling scheme as employed by the LDPC-decoding method according to the present invention.

The invention claimed is:

1. A method for decoding a noisy codeword received from a communication channel as the result of transmitting a LDPC codeword having a first number (N) of codeword bits which comprise a second number (K) of information bits and a third number (M) of parity check bits, wherein the product of the LDPC codeword and a predetermined M×N parity check matrix is zero, wherein the parity check matrix represents a bipartite graph comprising N variable nodes connected to M check nodes via edges according to matrix elements of the parity check matrix, the method comprising:

receiving the noisy codeword via said communication channel;

calculating, for each of said N codeword bits of said LDPC codeword, an a-priori estimate (Qv) that the codeword bit has a predetermined value from the received noisy codeword and from predetermined parameters of said communication channel;

storing the calculated estimates (Qv) for each variable node of said bipartite graph corresponding to a codeword bit in a memory as initialization variable node values; and iteratively calculating messages on all edges of said bipartite graph according to a serial schedule; wherein in each iteration, for each check node of said bipartite graph, for all neighboring variable nodes connected to said check node, input messages to said check node from said neighboring variable nodes and output messages from said check node to said neighboring variable nodes are calculated by means of a message passing computation rule.

2. The method of claim 1 wherein the bipartite graph is a Tanner graph.

3. The method of claim 1 wherein the message passing procedure is a belief propagation algorithm.

4. The method of claim 1 wherein the message passing procedure is a Min-Sum algorithm.

5. The method of claim 1 wherein the calculated a-priori estimates are log-likelihood ratios.

6. The method of claim 1 wherein the calculated a-priori estimates are probabilities.

7. The method of claim 1 wherein a decoding failure is indicated when the number of iterations reaches an adjustable threshold value.

8. An LDPC decoder operable to decode a noisy codeword received from a communication channel as the result of transmitting a LDPC codeword having a first number N of codeword bits which comprises a second number K of information bits and a third number N of parity check bits, wherein the product of the LDPC codeword and a predetermined M×N parity check matrix is zero, and wherein the parity check matrix represents a bipartite graph comprising N variable nodes connected to M check nodes via edges according to matrix elements of the parity check matrix, the LDPC decoder comprising:
(a) a memory operable to store a priori estimates for each codeword bit of the received noisy codeword that said codeword bit has a predetermined value from the received noisy codeword and from predetermined parameters of the communication channel; and
(b) a plurality of check node processing units operable to iteratively calculate messages on all edges of said bipartite graph according to a serial schedule, wherein in each iteration, for each check node of said bipartite graph, for all neighboring variable nodes connected to said check node, input messages to said check node from said neighboring variable nodes and output messages from the check node to said neighboring variable nodes are calculated by means of a message passing computation rule.

9. The LDPC decoder of claim 8 wherein the LDPC decoder comprises a read only memory for storing the bipartite graph.

10. The LDPC decoder of claim 8 wherein the LDPC decoder comprises a further memory operable to temporarily store the output messages.

11. The LDPC decoder of claim 8 wherein the LDPC decoder comprises a convergence testing block operable to indicate whether a decoding process has converged successfully.

12. The LDPC decoder of claim 8 where the LDPC codeword is encoded by multiplying an information bit vector with a K×N generator matrix, wherein the product of said generator matrix and the transposed parity check matrix is zero.

13. A method for decoding a noisy codeword received from a noisy communication channel as a result of a LDPC codeword transmitted through the communication channel, the transmitted LDPC codeword having a plurality of codeword bits which comprise a plurality of information bits and a plurality of parity check bits, the plurality of codeword bits belonging to a low-density parity-check code for which a parity check matrix is represented by a bipartite graph comprising a plurality of variable nodes connected to a plurality of check nodes via edges according to matrix elements of the parity check matrix, the method comprising:
(a) receiving the noisy codeword via said communication channel;
(b) calculating for each of the plurality of codeword bits of said transmitted LDPC codeword an a priori estimate that the codeword bit has a predetermined value from the received noisy codeword and from predetermined parameters of said communication channel;
(c) storing the calculated a priori estimates for each of the plurality of variable nodes of said bipartite graph in a memory as initialization varible node values;
(d) storing check-to-variable messages from each of the plurality of check nodes to all variable nodes of said bipartite graph in said memory, initialized to zero;
(e) iteratively calculating messages on all edges of said bipartite graph according to a serial schedule, in which at each iteration, all of the plurality of check nodes of said bipartite graph are serially traversed and for each of the plurality of check nodes of said bipartite graph the following calculations are performed:
(e1) reading from the memory stored messages and stored check-to-variable messages for all neighboring variable nodes connected to said check node;
(e2) calculating by means of a message passing computation rule, for all neighboring variable nodes connected to said check node, variable-to-check messages as a function of the messages and the check-to-variable messages read from said memory;
(e3) calculating by means of a message passing computation rule, for all neighboring variable nodes connected to said check node, updated check-to-variable messages as a function of the calculated variable-to-check message;
(e4) calculating by means of a message passing computation rule, for all neighboring variable nodes connected to said check node, updated a-posteriori messages as a function of the former messages and the updated check-to-variable messages;
(e5) storing the updated a posteri messages and updated check-to-variable messages back into said memory;
(f) calculating a decoded codeword as a function of the a-posteriori mesaages stored said memory;
(g) checking whether a decoding has converged by checking if the product of the parity check matrix and the decoded codeword is zero; and
(h) outputting the decoded codeword once the decoding has converged or once a predetermined maximum number of iterations has been reached.

* * * * *